US006865944B2

(12) United States Patent
Glenn et al.

(10) Patent No.: US 6,865,944 B2
(45) Date of Patent: Mar. 15, 2005

(54) METHODS AND SYSTEMS FOR DECELERATING PROOF MASS MOVEMENTS WITHIN MEMS STRUCTURES

(75) Inventors: Max C. Glenn, Chanhassen, MN (US); Mark W. Weber, Zimmerman, MN (US); William P. Platt, Columbia Heights, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/320,850

(22) Filed: Dec. 16, 2002

(65) Prior Publication Data

US 2004/0112133 A1 Jun. 17, 2004

(51) Int. Cl.[7] ............... G01C 19/00; G01P 15/08; G01P 3/44; G01P 9/00; G01P 15/125
(52) U.S. Cl. ................... 73/504.12; 73/514.32
(58) Field of Search .................. 73/504.04, 504.12, 73/514.14, 514.32, 514.36, 514.38

(56) References Cited

U.S. PATENT DOCUMENTS

| | | | |
|---|---|---|---|
| 4,882,933 A | 11/1989 | Petersen et al. ......... | 73/514.33 |
| 5,025,346 A | 6/1991 | Tang et al. ............. | 361/283.1 |
| 5,111,693 A | 5/1992 | Greiff ................. | 73/514.36 |
| 5,349,855 A | 9/1994 | Bernstein et al. ....... | 73/504.16 |
| 5,392,650 A | 2/1995 | O'Brien et al. ......... | 73/514.18 |
| 5,458,000 A | 10/1995 | Burns et al. ........... | 73/708 |
| 5,496,436 A | 3/1996 | Bernstein et al. ....... | 438/50 |
| 5,581,035 A | 12/1996 | Greiff ................. | 73/514.32 |
| 5,646,348 A | 7/1997 | Greiff et al. ........... | 73/514.36 |
| 5,721,377 A | 2/1998 | Kurle et al. ........... | 73/504.12 |
| 5,817,942 A | * 10/1998 | Greiff ................. | 73/514.01 |
| 5,892,153 A | 4/1999 | Weinberg et al. ....... | 73/504.16 |
| 5,952,574 A | 9/1999 | Weinberg et al. ....... | 73/504.16 |
| 6,040,625 A | 3/2000 | Ip .................... | 257/719 |
| 6,214,243 B1 | 4/2001 | Muenzel et al. ........ | 216/2 |
| 6,230,566 B1 | 5/2001 | Lee et al. ............. | 73/514.32 |
| 6,257,059 B1 | 7/2001 | Weinberg et al. ....... | 73/504.16 |
| 6,311,556 B1 | 11/2001 | Lefort et al. .......... | 73/514.29 |
| 6,350,983 B1 | 2/2002 | Kaldor et al. .......... | 250/231.1 |
| 6,426,538 B1 | 7/2002 | Knowles .............. | 257/417 |
| 6,481,285 B1 | 11/2002 | Shkel et al. .......... | 73/504.13 |
| 2001/0042404 A1 | 11/2001 | Yazdi et al. .......... | 73/504.12 |
| 2002/0066317 A1 | 6/2002 | Lin .................. | 73/504.02 |
| 2002/0093067 A1 | 7/2002 | Knowles .............. | 257/419 |
| 2002/0167248 A1 | 11/2002 | Chau et al. ........... | 310/329 |
| 2002/0178817 A1 | 12/2002 | Selvakumar et al. ..... | 73/514.32 |
| 2002/0184949 A1 | 12/2002 | Gianchandani et al. .. | 73/514.29 |

OTHER PUBLICATIONS

International Search Report dated Jun. 15, 2004, Appl. No. PCT/US03/40317, 8 pages.

EPO Patent Abstracts of Japan; vol. 013, No. 430 p. 937; Sep. 26, 1989 and JP 01 163620 A (Missan Motor Co. Ltd.); Jun. 27, 1989; 6 pgs.

* cited by examiner

*Primary Examiner*—Hezron Williams
*Assistant Examiner*—Tamiko Bellamy
(74) *Attorney, Agent, or Firm*—Matthew Luxton, Esq.; Armstrong Teasdale LLP

(57) ABSTRACT

A micro-electromechanical systems (MEMS) device is described which includes a substrate having at least one anchor, a proof mass having either of at least one deceleration extension extending from the proof mass or at least one deceleration indentation formed in the proof mass, a motor drive comb, and a motor sense comb. The MEMS device further includes a plurality of suspensions configured to suspend the proof mass over the substrate and between the motor drive comb and the motor sense comb, and the suspensions are anchored to the substrate. The MEMS device also includes a body attached to the substrate and at least one deceleration beam extending from the body. The deceleration extensions are configured to engage either deceleration beams or deceleration indentations and slow or stop the proof mass before it contacts either of the motor drive comb or the motor sense comb.

42 Claims, 6 Drawing Sheets

METHODS AND SYSTEMS FOR DECELERATING PROOF MASS MOVEMENTS WITHIN MEMS STRUCTURES

BACKGROUND OF THE INVENTION

This invention relates generally to micro-electromechanical systems (MEMS), and more specifically, to deceleration of movements within such devices to prevent damage of various components within the MEMS devices.

Micro-electromechanical systems (MEMS) integrate electrical and mechanical components on the same substrate, for example, a silicon substrate, using microfabrication technologies. The electrical components are fabricated using integrated circuit processes, while the mechanical components are fabricated using micromachining processes compatible with the integrated circuit processes. This combination makes it possible to fabricate an entire system on a chip using standard manufacturing processes.

One common application of MEMS devices is in the design and manufacture of sensor devices. The mechanical portion of the sensor device provides the sensing capability, while the electrical portion of the sensor device processes the information received from the mechanical portion. One example of a MEMS device is a gyroscope. Some inertial measurement units (IMUs) incorporate one or more MEMS gyroscopes.

One known type of MEMS gyroscope uses vibrating elements to sense angular rate through the detection of a Coriolis acceleration. The vibrating elements are put into oscillatory motion along a motor (X) axis, which is parallel to the substrate, in a resonant mode of vibration referred to as a motor mode. Once the vibrating elements are put in motion, the gyroscope is capable of detecting angular rates induced by the substrate being rotated about an input (Z) axis, which is perpendicular to the substrate. Coriolis acceleration occurs along a sense (Y) axis, which is also perpendicular to both the X and Z axes, causing oscillatory motion along the Y-axis, in a resonant mode referred to as a sense mode. The amplitude of oscillation of the sense mode is proportional to the angular rate of the substrate. However, the vibrating elements are sometimes acted upon by external forces. As an example, aircraft or other flight platforms sometimes make high gravitational force maneuvers. The forces can cause proof masses within the MEMS device, for example, a MEMS gyroscope, to contact a motor drive, a motor pickoff or a sense plate, sometimes at such a high rate of speed, that damage can occur to one or more of the above listed components. Such contact is undesirable and effects performance of the MEMS device.

BRIEF SUMMARY OF THE INVENTION

In one aspect, a micro-electromechanical systems device is provided which comprises a substrate having at least one anchor, a proof mass comprising either of at least one deceleration extension extending from the proof mass and at least one deceleration indentation formed in the proof mass, a motor drive comb, and a motor sense comb. The device also comprises a plurality of suspensions configured to suspend the proof mass over the substrate and between the motor drive comb and the motor sense comb which are anchored to the substrate. The device further comprises a body attached to the substrate and at least one deceleration beam extending from the body. The deceleration beams are configured to engage either the deceleration extensions or the deceleration indentations and slow or stop the proof mass before it contacts the motor drive comb and the motor sense comb.

In another aspect, a deceleration stop for a micro-electromechanical systems (MEMS) device is provided where the MEMS device includes a substrate and at least one proof mass. The deceleration stop comprises either at least one deceleration extension extending from the proof mass or at least one deceleration indentation formed in the proof mass, and a plurality of deceleration beams anchored to the substrate. The deceleration beams extend toward the proof mass. The deceleration extensions and deceleration indentations are configured to engage at least one of the deceleration beams and cause the proof mass to slow or stop before it contacts components of the MEMS device adjacent to the proof mass.

In still another aspect, a gyroscope is provided which comprises a substrate, at least one crossbeam anchored to the substrate, at least one proof mass each comprising either at least one deceleration extension or at least one deceleration indentation, and a plurality of suspensions connected to a respective one of the crossbeams. The suspensions are configured to suspend the proof masses above the substrate. The gyroscope further comprises motor drive combs adjacent each proof mass, motor sense combs adjacent each said proof mass, at least one body attached to each crossbeam, and a plurality of deceleration beams extending from the body. The deceleration extensions and deceleration indentations are configured to engage at least one of the deceleration beams and cause the proof masses to slow or stop before contacting the motor drive comb and the motor sense comb.

In yet another aspect, a method for reducing impacts and a speed of impacts between proof masses and adjacent components in micro-electromechanical systems (MEMS) devices is provided. The method comprises configuring the proof masses with at least one deceleration extension which extends from the proof mass or at least one deceleration indentation which is formed in the proof mass, providing a plurality of deceleration beams which extend towards the proof mass, and providing an anchor for the deceleration beams. The deceleration beams are configured to engage either the deceleration extensions or the deceleration indentations and cause the proof mass to slow or stop before contacting any component of the MEMS device adjacent to the proof mass.

In another aspect, a method for reducing impacts and a speed of impacts between proof masses and adjacent components in micro-electromechanical systems (MEMS) devices is provided. The proof masses are suspended above a substrate by a plurality of suspensions. The method comprises providing an anchor for the suspensions on the substrate, forming a body which extends towards a proof mass, anchoring the body, and configuring the body with a plurality of deceleration beams which extend towards the proof mass. The method also comprises configuring the proof mass with either a deceleration extension which extends from the proof mass or a deceleration indentation formed in the proof mass. The deceleration extension and deceleration indentation are configured to engage at least one of the deceleration beams and cause the proof mass to slow or stop before contacting any component of the MEMS device adjacent the proof mass.

DETAILED DESCRIPTION OF THE INVENTION

Figure 1:
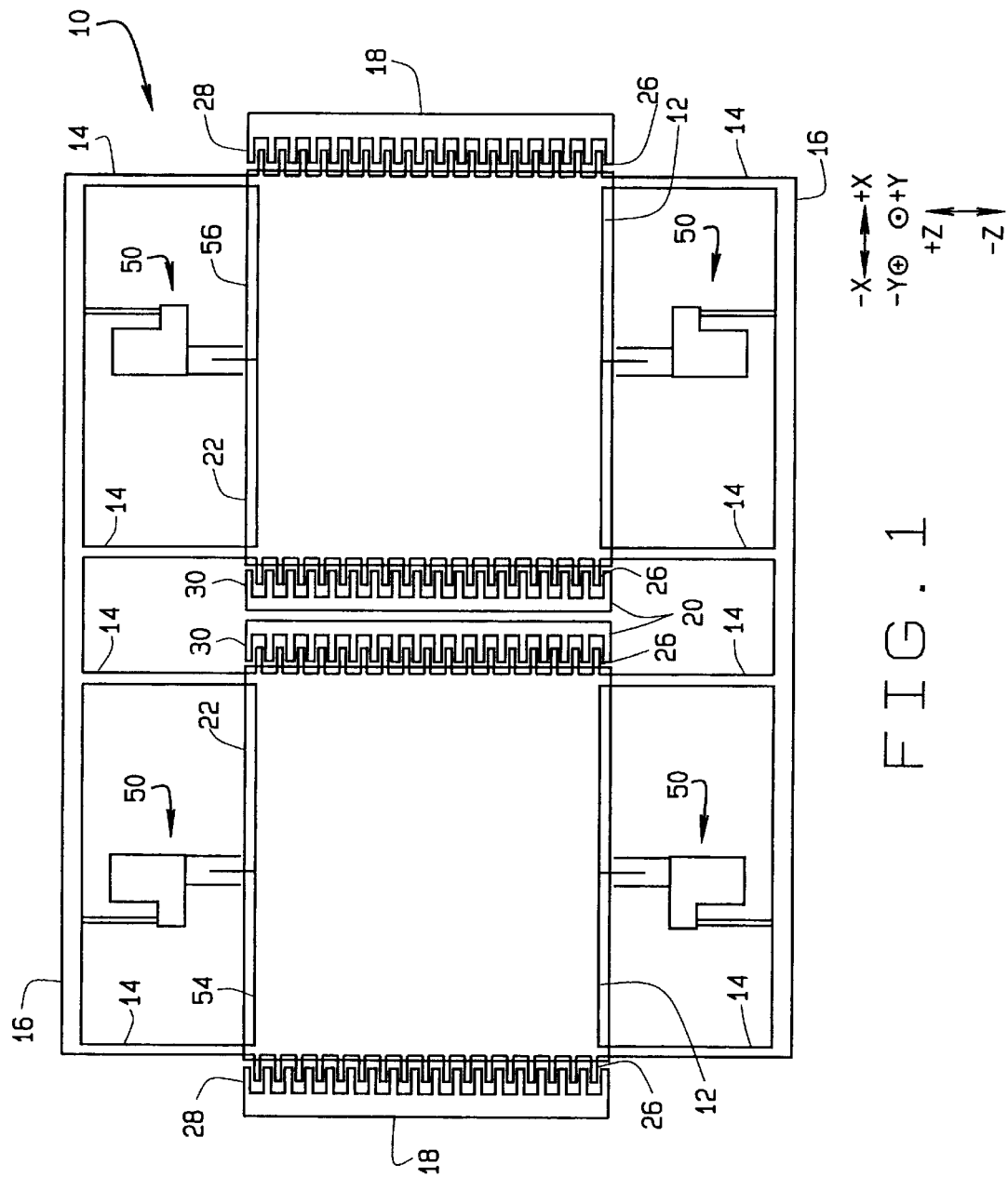
FIG. 1 is an illustration of micro-electromechanical system (MEMS) device which incorporates deceleration stops extending from the proof masses and a support structure.

FIG. 1 illustrates a plan view of a microelectromechanical system (MEMS) device 10, for example, a gyroscope. MEMS device 10 is formed on a substrate (not shown) and includes at least one proof mass 12, a plurality of suspensions 14 for supporting proof masses 12, and at least one cross beam 16 connected to suspensions 14. In an alternative configuration, suspensions 14 are individually and directly connected to the substrate. MEMS device 10 also includes motor drive combs 18, motor pickoff combs 20, and sense plates 22, which correspond to individual proof masses 12.

Proof masses 12 are fabricated from any mass suitable for use in a MEMS device. In one embodiment, proof mass 12 is a plate of silicon. Other materials compatible with micromachining techniques may also be utilized. While FIG. 1 shows two proof masses 12, MEMS devices utilizing fewer or greater than two proof masses may also be utilized.

Proof masses 12 are located substantially between motor drive comb 18 and motor pickoff comb 20. Proof masses 12 include a plurality of comb-like electrodes 26. A portion of electrodes 26 extends towards motor drive comb 18 and a portion of electrodes 26 extends towards motor pickoff comb 20. While, in the illustrated embodiment, proof masses 12 have thirty-four electrodes 26, it is known to utilize proof masses incorporating different numbers of electrodes. In other embodiments of MEM devices (not shown), motor drive comb and motor pickoff comb may be located next to one another.

Proof masses 12, in the embodiment shown, are supported above a respective sense plate 22 by suspensions 14. While four suspensions 14 are depicted for suspending each proof mass 12, any number of suspensions 14 which properly support proof masses 12 may be utilized. Suspensions 14 are, in one embodiment, beams micro-machined from a silicon wafer. Suspensions 14 also act as springs allowing proof masses 12 to move within a drive plane (X-axis) and a sense plane (Y-axis), as shown in FIG. 1.

Motor drive combs 18 include a plurality of comb-like electrodes 28 extending towards a respective proof mass 12. While motor drive combs 18 are shown as having eighteen electrodes 28, the number of electrodes 28 on motor drive combs 18 typically is determined by the number of electrodes 26 on the respective proof mass 12. Motor drive combs are typically connected to drive electronics (not shown in FIG. 1). Electrodes 26 and electrodes 28 are interdigitated as they extend from respective proof masses 12 and motor drive combs 18 and form capacitors which are utilized to generate motion in the drive plane (X-axis).

Motor pickoff combs 20 also include a plurality of comb-like electrodes 30 extending towards a respective proof mass 12. While motor pickoff combs 20 are depicted as having eighteen electrodes 30, the number of electrodes 30 extending from motor pickoff combs 20 is typically determined by the number of electrodes 26 on a respective proof mass 12. Motor pickoff combs 20 are sometimes referred to as sense combs. Electrodes 26 and electrodes 30 are interdigitated as they extend from respective proof masses 12 and motor pickoff combs 20 and form capacitors which are utilized to sense motion in the drive plane (X-axis).

Sense plates 22 are parallel with their respective proof mass 12 and form a capacitor. If an angular rate (i.e. an aircraft turning) is applied to MEMS device 10 operating as a gyroscope along an input vector (Z-axis) while the at least one proof mass 12 is oscillating along the drive plane (X-axis), a Coriolis acceleration is detected in the sense plane (Y-axis). The capacitance is used to sense motion in the sense plane (Y-axis). An output of MEMS device 10 typically is a signal proportional to the change in capacitance caused by the motion. Sense plates 22 are typically connected to sense electronics, not shown in FIG. 1. Sense electronics detect changes in capacitance as proof masses 12 move toward and/or away from their respective sense plates 22 and the respective motor drive combs 18 and motor pickoff combs 20.

Motor pickoff combs 20 are typically connected to a bias voltage (not shown) used in sensing motion of proof masses 12. Motor drive combs 18 are typically connected to drive electronics (not shown). The drive electronics cause the respective proof mass 12 to oscillate at substantially a tuning fork frequency along the drive plane (X-axis) by using the capacitors formed by the plurality of interdigitated comb-like electrodes 26, 28 of proof mass 12 and motor drive comb 18. MEMS device 10 has two closely spaced modes of oscillation. One of the modes, sometimes referred to as a motor mode, is driven by an electrostatic force, at a resonant frequency of device 10 to produce a relatively large amplitude of oscillation. When a rotational force is applied to device 10, a Coriolis force is produced which is proportional to the velocity of proof mass 12 in the motor mode. The Coriolis force drives proof masse 12 in a sense mode direction at a frequency of the motor mode. One or more electrodes are provided to detect oscillations in the sense mode, as described below, utilizing capacitance. A DC and/or an AC bias voltage is applied to sense electrodes, so that a motion of proof masses 12 in the sense mode produces an output current.

In certain operating environments, MEMS devices, for example, gyroscopes are subjected to extreme shock and vibration exposure, but also have to be mechanically sensitive enough to measure minute angular velocities and linear accelerations. Such forces may cause extensions 26 of proof masses 12 to forcefully come into contact with one or more of motor drive comb 18, its extensions 28, motor pickoff comb 20, and its extensions 30. In addition to a possibility that one or more of extensions 26, 28, and 30 could be broken off or otherwise damaged, electrostatic forces might cause proof mass 12 to remain in physical contact with the component of device 10 the proof mass 12 has contacted. Other forces may cause the main body of proof mass 12 to come into contact with sense plate 22. Again, the electrostatic forces may cause proof mass 12 to remain in contact with sense plate 22.

MEMS device 10 is also configured with a plurality of deceleration stops 50 which reduce or alleviate the above described operational problems caused by excessive external mechanical forces. Device 10 utilizes deceleration stops 50 to provide the external force protection. Proof masses 12 are further identified as a left proof mass 54 and a right proof mass 56. The terms "left" and "right" as used herein are for illustrative purposes with respect to the Figures only to describe operation of deceleration stops 50, and do not imply any type of structural limitations of MEMS device 10. Left proof mass 54 and right proof mass 56 are supported above the substrate, as described above, by suspensions 14. While suspensions 14 suspend proof masses 54 and 56 above a substrate (not shown) onto which a sense plate (not shown) is typically mounted, suspensions 14 also allow proof masses 54 and 56 to vibrate upon application of a bias voltage. As proof masses 54 and 56 vibrate, extensions 26 move back and forth between extensions 28 of motor drive combs 18 and extensions 30 of motor pickoff combs 20, causing capacitance changes which can be quantified.

Figure 2:
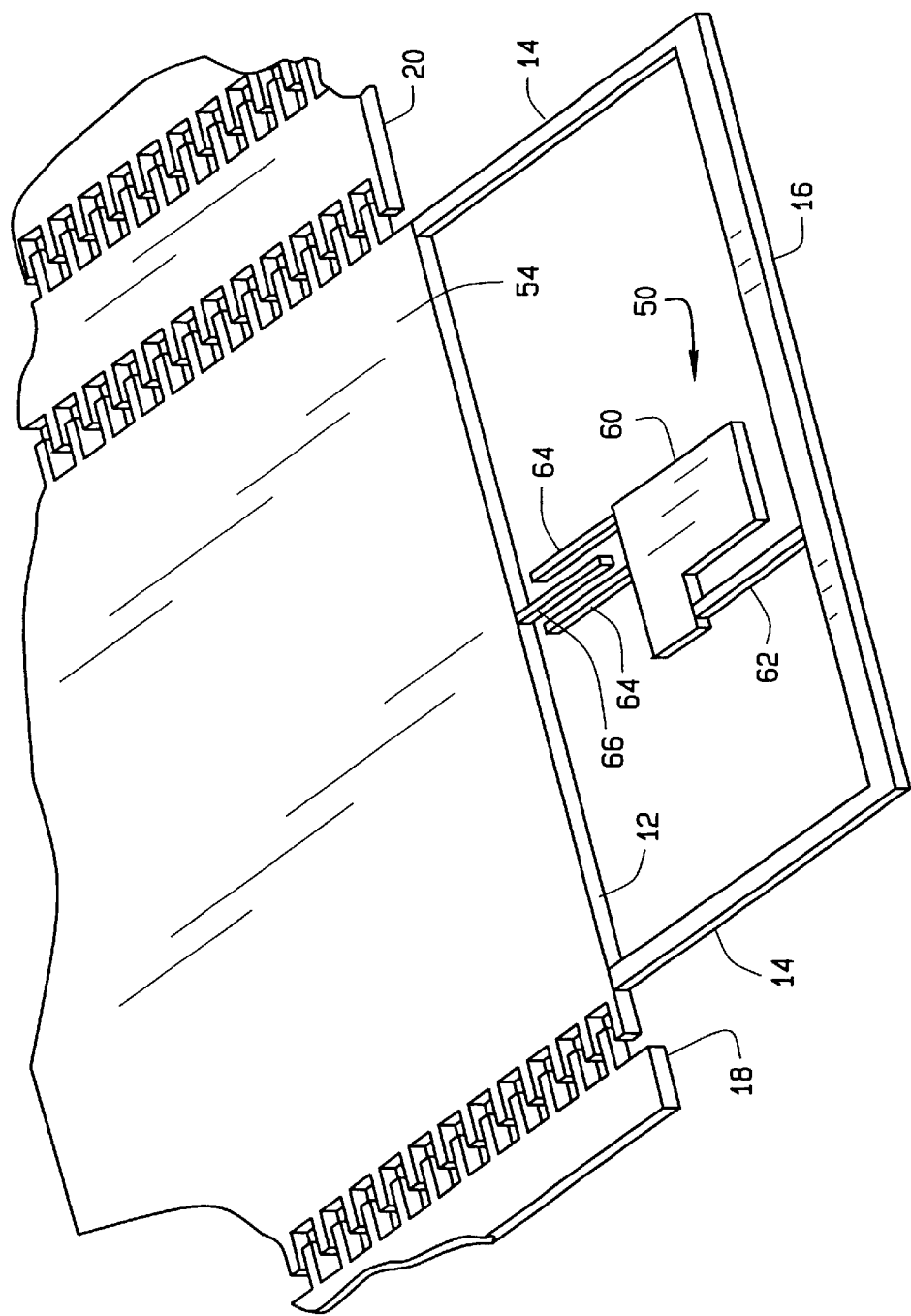
FIG. 2 is an illustration showing an enlarged view of the deceleration stops shown in FIG. 1.

FIG. 2 is an illustration which details a deceleration stop 50 which operates to prevent left proof mass 54 from contacting motor drive comb 18 and motor sense comb 20. While a single deceleration stop 50 is illustrated and described with respect to left proof mass 54, it is to be understood that the description applies to deceleration stops utilized in conjunction with any proof mass (including right proof mass 56) and that multiple deceleration stops 50 can be associated with any individual proof mass (as shown in FIG. 1). Deceleration stop 50 includes a body 60 which, in one embodiment, is located between cross beam 16 and proof mass 54, and is attached to crossbeam 16 through an anchoring extension 62. In one embodiment, body 60 is attached to the substrate and provides an anchoring function for the MEMS device. In addition, a plurality of deceleration beams 64 extend from body 60 towards proof mass 54. A deceleration extension 66 located in between deceleration beams 64 extends from proof mass 54. Deceleration beams 64 and deceleration extension 66 allow proof mass 54 to move freely under normal motion conditions, but serve to decelerate proof mass 54 when the motion of proof mass 54 exceeds a certain limit. In one embodiment, deceleration beams 64 are positioned closer to extensions 86 when proof mass 54 is to combs 28 and 30. As shown in FIGS. 1 and 2, deceleration beams 64 and deceleration extensions 66, in one embodiment, are elongated rectangular structures.

Specifically, when a motion of proof mass 54 causes deceleration extension 66 to engage one of deceleration beams 64, due to an external force, one or both of deceleration beams 64 and deceleration extension 66 bend, decelerating proof mass 54 such that when proof mass 54 contacts a fixed stop, an impact is significantly reduced or eliminated. The deceleration of proof mass 54 due to deceleration stops 50 prevents damage to the interdigitating members of proof mass 54, motor drive comb 18, and motor pickoff comb 20.

Figure 3:
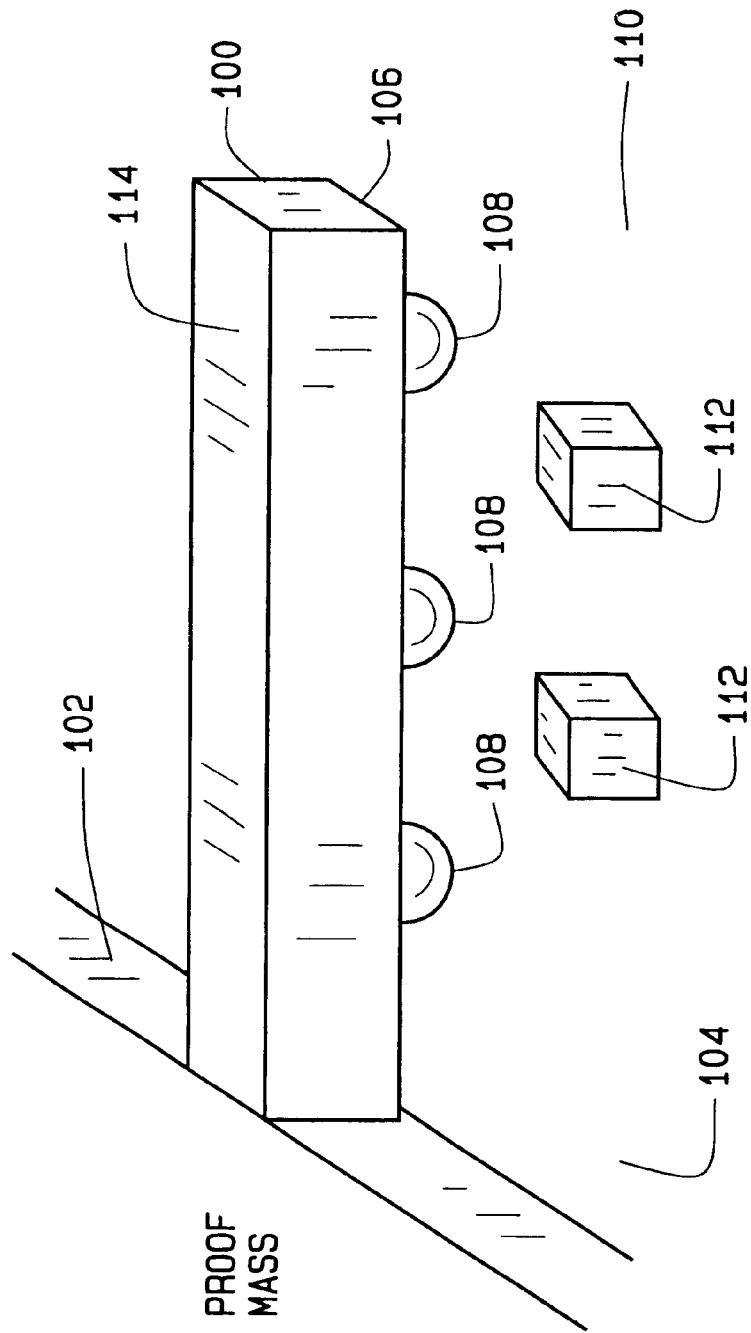
FIG. 3 is an illustration showing one embodiment of a deceleration extension extending from a proof mass.

External forces may also cause proof mass 54 to move up and down. FIG. 3 is an illustration showing one embodiment of a deceleration extension 100 extending from a proof mass 102. It is known that when a proof mass 102 experiences a downward motion that causes proof mass 102 to contact a sense plate 104 electrostatic forces may cause proof mass 102 to remain in contact with sense plate 104 once the forces that originally caused the downward motion of proof mass 102 cease to exist. Continuing contact between proof mass 102 and sense plate 104 causes the MEMS device to cease to function.

To reduce the adverse effects of the above described problem, a bottom surface 106 of deceleration extension 100 is formed with a number of raised, semi-spherical areas 108 extending downward from deceleration extension 100. When raised, set-spherical areas 108 contact substrate 110 downward motion of proof mass 102 is stopped thus preventing proof mass 102 from contacting sense plate 104 or substrate 110. In alternative embodiments, substrate 110 is formed with raised areas 112 which engage deceleration extensions 100 directly (as shown) or that engage raised, semi-spherical areas 108 to provide even more separation between proof mass 102 and sense plate 104. In one embodiment, a top surface 114 of deceleration extension is formed with a number of raised areas 113 similar to raised, semi-spherical areas 108 which are configured to reduce or eliminate contact between the proof mass and components of the MEMS device which are above the proof mass. While raised areas 108 and 113 are described and shown as being semi-spherical and raised areas 112 are shown as rectangular blocks, it is understood that other embodiments exist which utilize different shapes to provide the same functionality.

Figure 4:
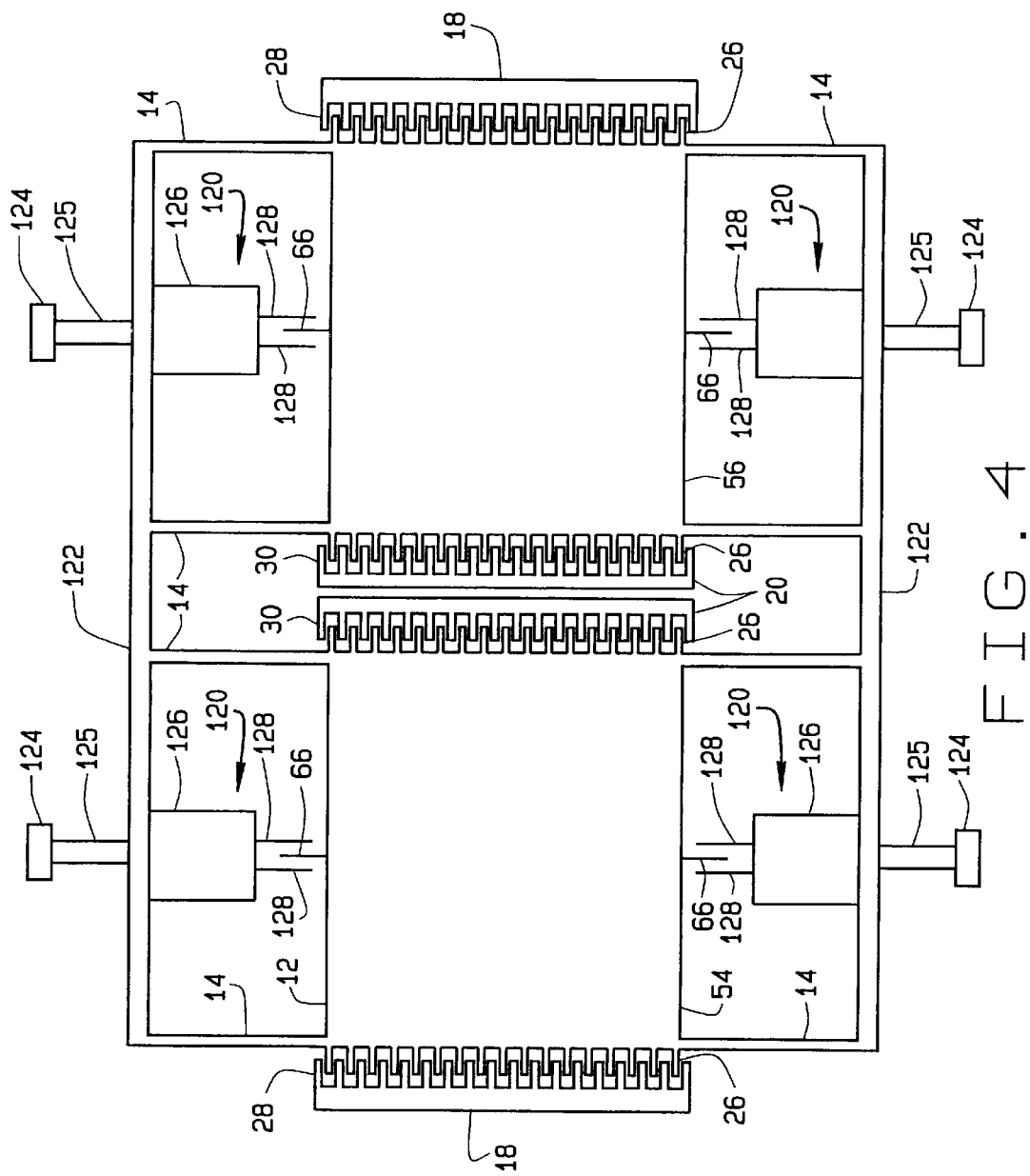
FIG. 4 is an illustration of a MEMS device which incorporates deceleration stops extending from the proof masses and an alternative anchoring structure to the device of FIG. 1.
Figure 5:
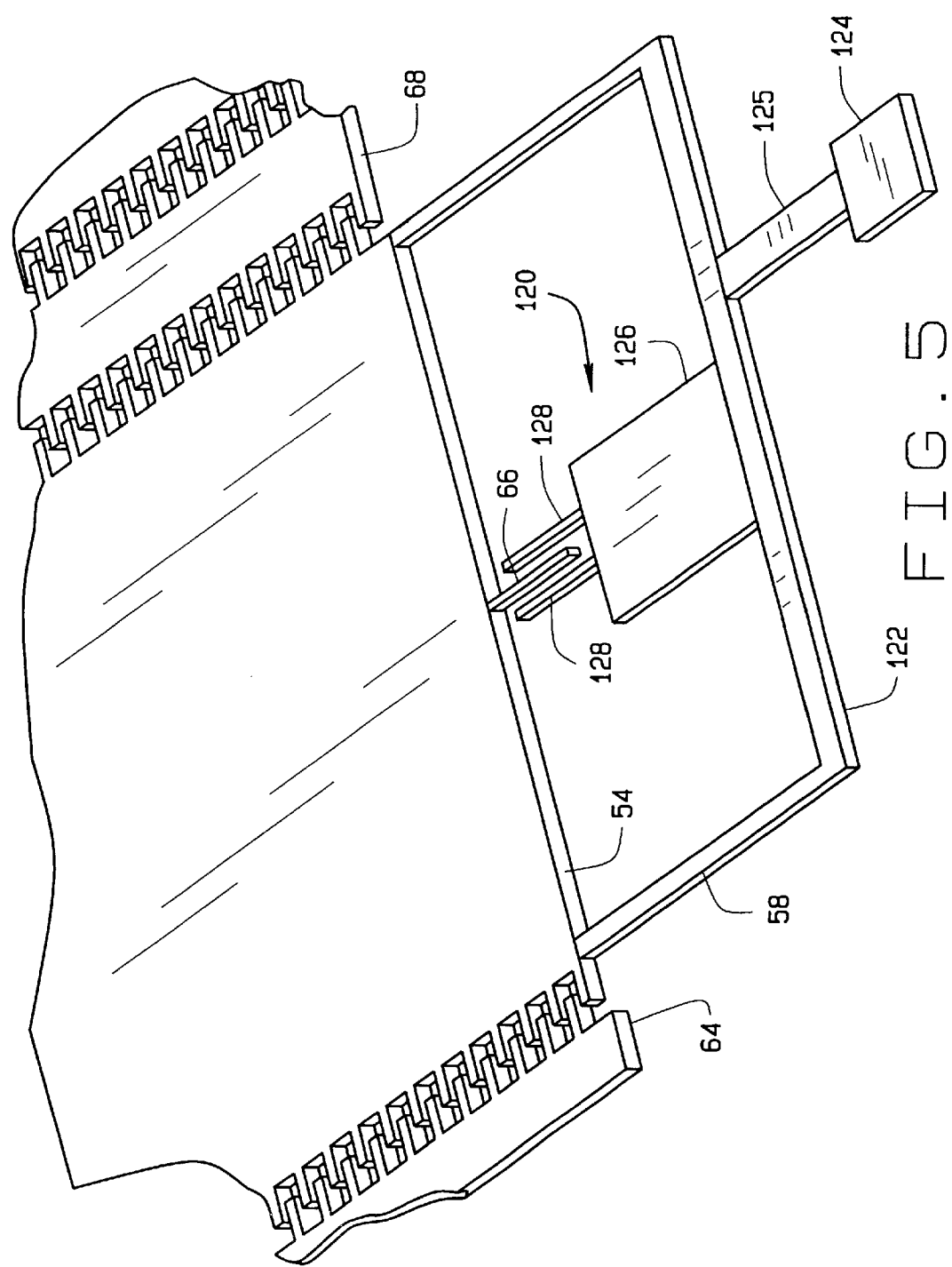
FIG. 5 is an illustration showing an enlarged view of the deceleration stop shown in FIG. 4.

FIGS. 4 and 5 illustrate an alternative embodiment of deceleration stops 120. Components in FIGS. 4 and 5 which are the same as components shown in FIGS. 1 and 2 are shown utilizing the same reference numerals as utilized in FIGS. 1 and 2. Referring to FIG. 4, crossbeams 122 are connected to the substrate (not shown) utilizing anchors 124 and anchoring extensions 125 that extend between anchors 124 and crossbeams 122. A body 126 extends from crossbeams 122 which includes deceleration beams 128 that extend towards one of respective proof masses 54 and 56. Body 126 extends from crossbeam 122 towards a proof mass 54, 56 and can be any shape that can be formed integrally with, and extend from crossbeams 122. In the embodiment shown, body 126 is rectangular in shape. The structure of deceleration stops 120 is shown in more detail in FIG. 5. Deceleration beams 128 are configured to engage deceleration extension 66, based upon movements of proof mass 54. Decelerations tops 120 differ from deceleration stops 50 (shown in FIGS. 1 and 2) since deceleration stops 120 do not provide the anchoring function for the suspension of MEMS device as body 60 (shown in FIG. 2) does.

Figure 6:
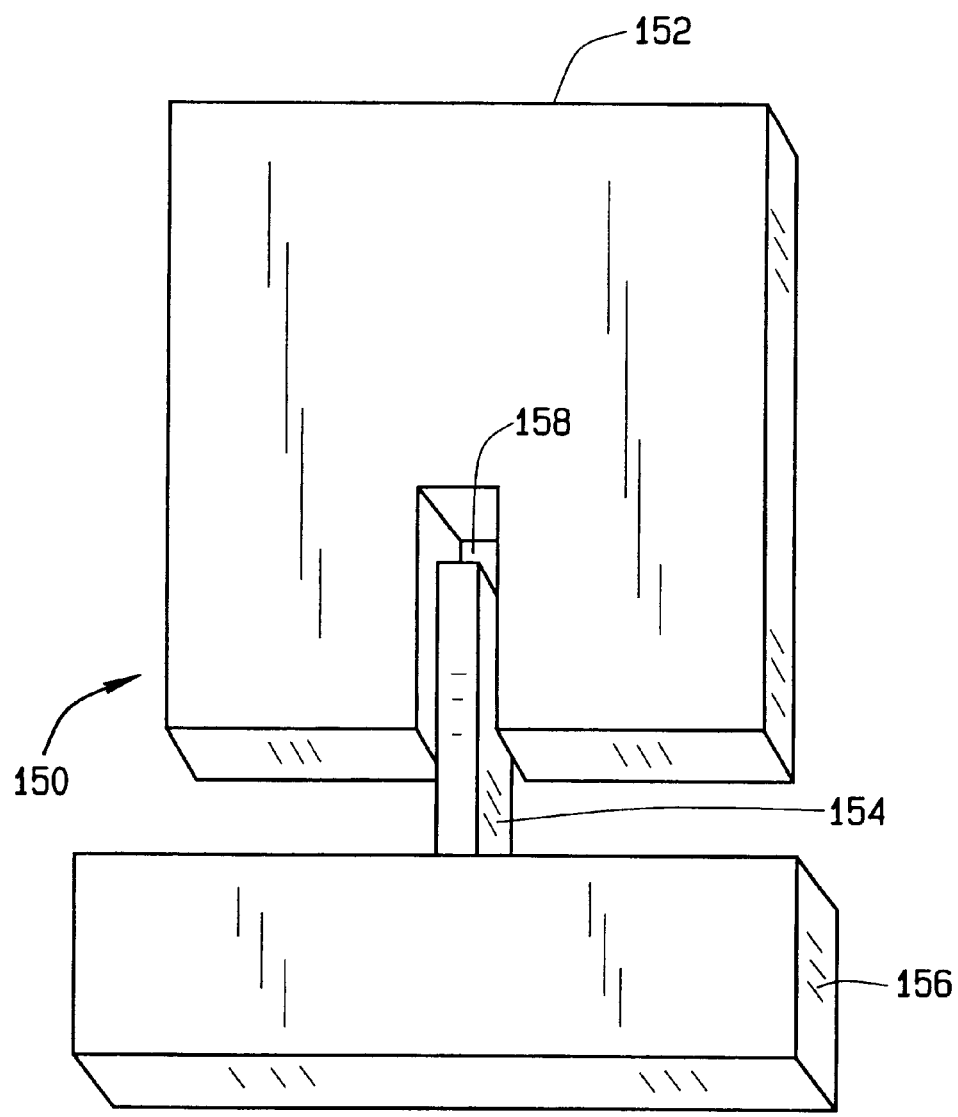
FIG. 6 is an illustration showing an alternative embodiment for decelerating proof masses.

FIG. 6 is an illustration showing an alternative embodiment of a deceleration stop 150 for decelerating proof masses 152. It should be noted that proof mass 152 is shown in a partial view, with only the portion relevant to deceleration stop 150 being shown. In the embodiment, a deceleration beam 154 extends from a body 156 anchored to a substrate (not shown) towards proof mass 152. Rather than being configured with deceleration extensions to engage deceleration beams as described above, proof mass 152 is formed with a rectangular indentation, hereafter referred to as deceleration indentation 158 that engages deceleration beam 154. Forming proof masses with deceleration indentations 158, rather than deceleration extensions, may allow a larger proof mass to be formed for a given area. In an alternative embodiment, a deceleration beam may extend from a proof mass, while a deceleration indentation is formed within the anchoring body.

While shown and described as utilizing a single deceleration beam 154 and deceleration indentation 158, it is understood that a MEMS device can incorporate more than one deceleration beam 154 and deceleration indentation 158 as a deceleration stop. In addition, several deceleration stops 150, using either single or multiple deceleration beams 154 and deceleration indentations 158 can be incorporated into a MEMS device, in a configuration similar to that shown in FIG. 1, where four deceleration stops 50 are illustrated. Further, proof mass 152 may be constructed with a plurality of raised, semi-spherical areas 108 (shown in FIG. 3) to alleviate the contacting problems between proof masses and sense plates described with respect to FIG. 3.

The above described deceleration stop embodiments, and the embodiments which are utilized to counteract the effects of up and down movement of proof masses are utilized to protect the components of MEMS devices from extreme forces that can be encountered during use. Described with respect to MEMS devices, the descriptions should be construed to be include, but not be limited to, MEMS gyroscopes, inertial measurement units, accelerometers, pressure sensors, and temperature sensors.

While the invention has been described in terms of various specific embodiments, those skilled in the art will recognize that the invention can be practiced with modification within the spirit and scope of the claims.

What is claimed is:

1. A micro-electromechanical systems (MEMS) device comprising:
    a substrate comprising at least one anchor;
    a proof mass comprising either or both of at least one deceleration extension extending from said proof mass and at least one deceleration indentation formed in said proof mass;
    a motor drive comb;
    a motor sense comb;
    a plurality of suspensions configured to suspend said proof mass over said substrate and between said motor drive comb and said motor sense comb, said suspensions anchored to said substrate;
    a body attached to said substrate; and
    at least one deceleration beam extending from said body, said deceleration beams configured to engage either said at least one deceleration extension or said at least one deceleration indentation and slow or stop said proof mass before said proof mass contacts said motor drive comb and said motor sense comb.

2. A device according to claim 1 wherein said device further comprises at least one crossbeam extending between said suspensions, said body connected to said crossbeam and attached to said substrate.

3. A device according to claim 2 wherein said device further comprises an anchoring extension which is utilized to connect said body to said crossbeam.

4. A device according to claim 1 wherein said device further comprises:
    at least one crossbeam extending between said suspensions; and
    an anchor attached to said crossbeam and said substrate, said body connected to said crossbeam.

5. A device according to claim 1 wherein said at least one deceleration extension comprises:
    a bottom surface; and
    at least one raised area on said bottom surface, said raised areas configured to reduce or eliminate contact between said proof mass and components of said device under said proof mass.

6. A device according to claim 1 wherein said at least one deceleration extension comprises:
    a top surface; and
    at least one raised area on said top surface, said raised areas configured to reduce or eliminate contact between said proof mass and components of said device above said proof mass.

7. A device according to claim 1 wherein said proof mass is configured with at least one deceleration indentation, said proof mass further comprising:
    a top surface;
    a bottom surface; and
    at least one raised area on either or both of said top surface and said bottom surface, said raised areas configured to reduce or eliminate contact between said proof mass and components of said device above and under said proof mass.

8. A device according to claim 1 wherein said substrate comprises at least one raised area configured to engage said deceleration extension said raised area configured to reduce or eliminate contact between said proof mass and components of said device under said proof mass.

9. A device according to claim 1 wherein said deceleration extensions and said deceleration beams are configured to bend when engaged and provide the deceleration function for said proof mass.

10. A device according to claim 1 wherein said at least one deceleration extension and said at least one deceleration beam are elongated rectangular structures.

11. A device according to claim 1 wherein said at least one deceleration indentation is elongated and rectangular.

12. A device according to claim 1 wherein said device comprises a plurality of said proof masses.

13. A device according to claim 1 wherein said device comprises at least one of a gyroscope, an inertial measurement unit, an accelerometer, a pressure sensor, and a temperature sensor.

14. A deceleration stop for a micro-electromechanical systems (MEMS) device, the MEMS device comprising a substrate and at least one proof mass, said deceleration stop comprising:
    a body;
    either at least one deceleration extension extending from said proof mass or at least one deceleration indentation formed in said proof mass; and
    a plurality of deceleration beams extending from said body, said deceleration beams extending toward said proof mass, said deceleration extensions and said deceleration indentations configured to engage at least one of said deceleration beams and cause grid proof mass to slow or stop before contacting components of the MEMS device adjacent to said proof mass.

15. A deceleration stop according to claim 14 wherein said body is anchored to the substrate.

16. A deceleration stop according to claim 15 further comprising an anchoring extension which is utilized to connect said body to a crossbeam of the MEMS device.

17. A deceleration stop according to claim 14 wherein said deceleration extensions comprise:
    a top surface;
    a bottom surface; and
    at least one raised area on at least one of said bottom surface and said top surface, said areas configured to reduce or eliminate contact between the proof mass and components of the MEMS device above and below the proof mass.

18. A deceleration stop according to claim 14 wherein said proof masses comprise;
    a top surface;
    a bottom surface; and
    at least one raised area on at least one of said bottom surface and said top surface, said areas configured to reduce or eliminate contact between said proof mass and components of the MEMS device above and below said proof mass.

19. A deceleration stop according to claim 14 wherein said deceleration extensions and said deceleration beams are configured to bend when engaged, providing a deceleration function for said proof mass.

20. A deceleration stop according to claim 14 wherein said deceleration extensions and said deceleration beams are elongated rectangular structures.

21. A deceleration stop according to claim 14 wherein said deceleration indentations are elongated and rectangular.

22. A gyroscope comprising:
   a substrate;
   at least one crossbeam anchored to said substrate;
   at least one proof mass, each said proof mass comprising either at least one deceleration extension or at least one deceleration indentation;
   a plurality of suspensions connected to a respective one of said crossbeams and configured to suspend said proof masses above said substrate;
   motor drive combs adjacent each said proof mass;
   motor sense combs adjacent each said proof mass;
   at least one body attached to each said crossbeam; and
   a plurality of deceleration beams extending from said body, said deceleration extensions and said deceleration indentations configured to engage at least one of said deceleration beams and cause said proof masses to slow or stop before contacting said motor drive comb and said motor sense comb.

23. A gyroscope according to claim 22 wherein said body is anchored to said substrate.

24. A gyroscope according to claim 22 further comprising an anchoring extension utilized to connect said body to said crossbeam.

25. A gyroscope according to claim 22 wherein said deceleration extensions comprise:
   a top surface;
   a bottom surface; and
   at least one raised area on at least one of said bottom surface and said top surface, said raised areas configured to reduce or eliminate contact between said proof masses and components of said gyroscope above and below said proof masses.

26. A gyroscope according to claim 22 wherein said proof masses comprise;
   a top surface;
   a bottom surface; and
   at least one raised area on at least one of said bottom surface and said top surface, said raised areas configured to reduce or eliminate contact between said proof masses and components of said gyroscope above and below said proof masses.

27. A gyroscope according to claim 22 wherein said deceleration extensions and said deceleration beams are configured to bend when engaged, providing deceleration for said proof masses.

28. A gyroscope according to claim 22 wherein said deceleration extensions and said deceleration beams are elongated rectangular structures.

29. A gyroscope according to claim 22 wherein said deceleration indentations are elongated and rectangular.

30. A method for reducing impacts and a speed of impacts between proof masses and adjacent components in microelectromechanical systems (MEMS) devices, said method comprising:
   configuring the proof masses with at least one deceleration extension which extends from the proof mass;
   providing a plurality of deceleration beams which extend towards the proof mass from a body, the deceleration extensions configured to engage at least one of the deceleration beams and cause the proof mass to slow or stop before contacting any component of the MEMS device adjacent to the proof mass; and
   providing an anchor for the body.

31. A method according to claim 30 further comprising configuring at least one of an upper surface and a bottom surface of the deceleration extensions with at least one raised area, the raised areas configured to reduce or eliminate contact between the proof mass and components of the MEMS device which are above or below the proof mass.

32. A method for reducing impacts and a speed of impacts between proof masses and adjacent components in microelectromechanical systems (MEMS) devices, said method comprising:
   configuring the proof masses with at least one deceleration indentation formed in the proof mass;
   providing a plurality of deceleration beams which extend towards the proof mass from a body, the deceleration beams configured to engage at least one of the deceleration indentations and cause the proof mass to slow or stop before contacting any component of the MEMS device adjacent to the proof mass; and
   providing an anchor for the body.

33. A method according to claim 32 further comprising configuring at least one of an upper surface and a bottom surface of the proof masses with at least one raised area, the raised areas configured to reduce or eliminate contact between the proof mass and components of the MEMS device which are above or below the proof mass.

34. A method for reducing impacts and a speed of impacts between proof masses and adjacent components in microelectromechanical systems (MEMS) devices, the proof masses being suspended above a substrate by a plurality of suspensions, said method comprising:
   providing an anchor for the suspensions on the substrate;
   forming a body which extends towards a proof mass;
   anchoring the body;
   configuring the body with a plurality of deceleration beams which extend towards the proof mass; and
   configuring the proof mass with either at least one deceleration extension extending from the proof mass or at least one deceleration indentation formed in the proof mass, the deceleration extensions and deceleration indentations configured to engage at least one of the deceleration beams and cause the proof mass to slow or stop before contacting any component of the MEMS device adjacent the proof mass.

35. A method according to claim 34 further comprising configuring at least one of an upper surface and a bottom surface of the deceleration extension with at least one raised area, the raised areas configured to reduce or eliminate contact between the proof mass and components of the MEMS device which are above or below the proof mass.

36. A method according to claim 34 further comprising configuring at least one of an upper surface and a bottom surface of the proof masses with at least one raised area, the raised areas configured to reduce or eliminate contact between the proof mass and components of the MEMS device which are above or below the proof mass.

37. A method according to claim 34 further comprising configuring the substrate with at least one raised area configured to engage a bottom surface of the deceleration extension or the proof mass, engagement of the raised area and the bottom surface reducing or eliminating contact between the proof mass and components of the MEMS device which are below the proof mass.

38. A method according to claim 34 wherein anchoring the body comprises anchoring the body directly to the substrate, the body also providing the anchor for the suspensions.

39. A method according to claim 34 wherein providing an anchor for the suspensions comprises:

providing a crossbeam between suspensions; and anchoring the crossbeam to the substrate.

40. A method according to claim 39 wherein anchoring the body comprises attaching the body to the crossbeam.

41. A method according to claim 40 wherein anchoring the crossbeam to the substrate comprises connecting an anchoring extension between the body and the crossbeam.

42. A deceleration stop for a micro-electromechanical systems (MEMS) device, the MEMS device comprising a substrate, and at least one proof mass suspended above said substrate, said deceleration stop comprising:

a body attached to said substrate;

at least one deceleration beam extending from said proof mass; and at least one deceleration indentation formed in said body; said at least one deceleration extension configured to engage said at least one deceleration indentation and cause said proof mass to slow or stop before contacting components of the MEMS device adjacent to said proof mass.

* * * * *

UNITED STATES PATENT AND TRADEMARK OFFICE
CERTIFICATE OF CORRECTION

PATENT NO. : 6,865,944 B2
APPLICATION NO. : 10/320850
DATED : March 15, 2005
INVENTOR(S) : Glenn et al.

It is certified that error appears in the above-identified patent and that said Letters Patent is hereby corrected as shown below:

In Detailed Description of Invention, column 4, line 40, delete "proof masse" and insert therefor -- proof masses --.

Signed and Sealed this

Twenty-fifth Day of September, 2007

JON W. DUDAS
*Director of the United States Patent and Trademark Office*